United States Patent

Makita et al.

Patent Number: 5,814,835
Date of Patent: Sep. 29, 1998

[54] SEMICONDUCTOR DEVICE AND METHOD FOR FABRICATING THE SAME

[75] Inventors: Naoki Makita, Nara; Tadayoshi Miyamoto; Tsukasa Shibuya, both of Tenri, all of Japan; Masashi Maekawa, Vancouver, Wash.

[73] Assignee: Sharp Kabushiki Kaisha, Osaka, Japan

[21] Appl. No.: 558,501

[22] Filed: Nov. 16, 1995

[30] Foreign Application Priority Data

Nov. 22, 1994 [JP] Japan ....................... 6-288135

[51] Int. Cl.$^6$ ............................. H01L 29/04
[52] U.S. Cl. ..................... 257/64; 257/65; 257/66; 257/347
[58] Field of Search ................... 257/64, 65, 66, 257/75, 347

[56] References Cited

U.S. PATENT DOCUMENTS 5,608,232 3/1997 Yamazahi et al. .................... 257/66

FOREIGN PATENT DOCUMENTS

| 241377 | 2/1995 | China . |
| 260805 | 10/1995 | China . |
| 260831 | 10/1995 | China . |
| 6-244103 | 9/1994 | Japan . |
| 6-244104 | 9/1994 | Japan . |

*Primary Examiner*—Mark V. Prenty
*Attorney, Agent, or Firm*—Nixon & Vanderhye P.C.

[57] ABSTRACT

The semiconductor device of invention includes: a substrate having an insulating surface; and an element region formed by crystallizing an amorphous silicon film, the element region being provided on the insulating surface of the substrate. In the semiconductor device, the element region is constituted by a laterally crystallized region formed by crystallizing the amorphous silicon film from a linearly crystallized region crystallized by a selective introduction of catalyst elements for promoting a crystallization of the amorphous silicon film to a region surrounding the linearly crystallized region by performing a heat-treatment, and a concentration of the catalyst elements in at least one of the laterally crystallized region and the linearly crystallized region is controlled by a line width of an introduction setting region having a linear planar pattern, the line width being set so as to selectively introduce the catalyst elements.

9 Claims, 6 Drawing Sheets

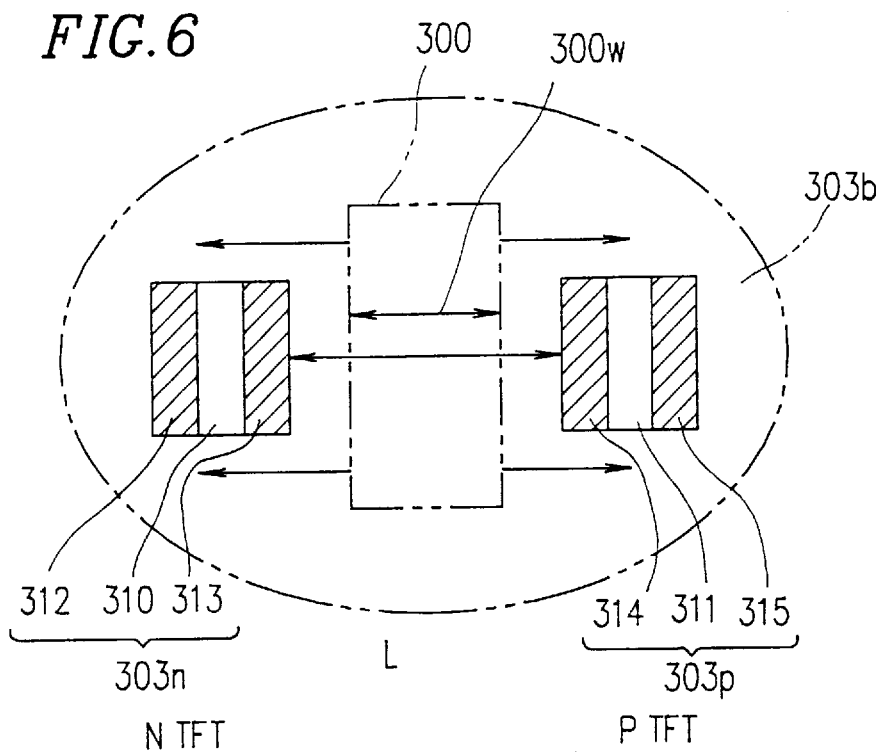

SEMICONDUCTOR DEVICE AND METHOD FOR FABRICATING THE SAME

BACKGROUND OF THE INVENTION

1. Field of the Invention

The present invention relates to a semiconductor device and a method for fabricating the same. More specifically, the present invention relates to a semiconductor device having a crystalline silicon film obtained by crystallizing an amorphous silicon film as an element region and a method for fabricating the same. The present invention is particularly effective as a semiconductor device including a thin-film transistor (TFT) provided on an insulating substrate; and as such, is useful in an active-matrix type liquid crystal display device, a close-contact type image sensor, a three-dimensional IC, and the like.

2. Description of the Related Art

In order to realize a large-scale liquid crystal display device with a high resolution, a fast-response close-contact image sensor or a three-dimensional IC with a high resolution and the like, much effort has been directed to forming a high-performance semiconductor device on an insulating substrate such as a glass substrate or on an insulating film. A thin-film silicon semiconductor layer is generally used for a semiconductor device applicable to these devices.

Such a thin-film silicon semiconductor layer is roughly classified into two categories; namely, that made of an amorphous silicon (a-Si) semiconductor and that made of a crystalline silicon semiconductor. Of the above-mentioned two types of thin-film silicon semiconductors, an amorphous silicon semiconductor is currently used most frequently for general applications. This is because an amorphous silicon semiconductor can be mass-produced using a vapor-phase growing method more easily and at a relatively low temperature as compared with a crystalline silicon semiconductor. Despite these advantages, the physical properties, e.g., conductivity, of the amorphous silicon semiconductor are inferior to those of the crystalline silicon semiconductor. In order to realize higher performance characteristics, there has been a great demand for the establishment of a method for fabricating a semiconductor device made of a crystalline silicon semiconductor. Examples of crystalline silicon semiconductors include polycrystalline silicon, microcrystalline silicon, amorphous silicon containing a crystalline component, and semi-amorphous silicon exhibiting an intermediate state between crystallinity and non-crystallinity.

The following three methods are currently employed for obtaining the above-mentioned thin-film silicon semiconductor layer exhibiting some crystallinity.

(1) A crystalline silicon semiconductor film is grown directly on a substrate during the deposition of the film.

(2) An amorphous silicon semiconductor film is initially deposited, and subsequently crystallized using laser beam energy or the like.

(3) An amorphous silicon semiconductor film is initially deposited, and subsequently crystallized by the application of thermal energy thereto.

These conventional methods, however, have the following problems.

In employing method (1), the deposition and the crystallization of the film proceed simultaneously. Therefore, it is indispensable to deposit a thick silicon film in order to obtain a crystalline silicon film composed of grains having a large size. However, it is technologically difficult to uniformly deposit a film having satisfactory semiconductor physical properties over the entire surface of a substrate. Furthermore, since such a film is deposited at a relatively high temperature of 600° C. or higher, an inexpensive glass plate is unsuitable as a substrate which can be used in this method, so that the necessary cost becomes disadvantageously high.

In employing method (2), a crystallization phenomenon is utilized during a process for melting and solidifying a film. As a result, the grain boundaries are satisfactorily treated even though the grain size of the resulting crystal is small. Thus, a crystalline silicon film of high quality can be obtained. Though this method (2) has such advantages, when an excimer laser beam which is currently used most frequently is irradiated, for example, the area to be irradiated with the laser beam is small, so that throughput becomes disadvantageously low. In addition, the stability of the excimer laser is not sufficient in order to uniformly treat the entire surface of a large-scale substrate. In light of these problems, method (2) is regarded as a next-generation technology.

Method (3) has the advantage of being applicable to the treatment of a larger-scale substrate as compared with methods (1) and (2); however, a heat treatment at a high temperature of 600° C. or higher over several tens of hours is needed to realize the crystallization. Thus, in order to reduce costs by using an inexpensive glass substrate and improve the resulting throughput, two incompatible purposes must be fulfilled at the same time: the heating temperature must be lowered for the purpose of reducing the cost, and the crystallization must be realized in a shorter period of time in order to improve the throughput.

In addition, since method (3) utilizes a solid phase crystallization (epitaxy) phenomenon, crystal grains are laterally grown in parallel with respect to the substrate surface, so that grains having a size of several $\mu$m are obtained. As a result, the crystal grains thus grown come into contact with each other so as to form grain boundaries. Since these grain boundaries function as a trap level for carriers, the presence of the grain boundaries is likely to cause the decrease in field-effect mobility of TFTs.

Japanese Laid-Open Patent Publications Nos. 5-55142 and 5-136048 disclose methods for solving the above-described problems of the grain boundaries by employing method (3). According to these disclosed methods, by initially introducing some foreign material into an amorphous silicon film as a nucleus for crystal growth and then by heat-treating the film, a crystalline silicon film composed of grains having a large size can be grown by using the foreign material as a nucleus.

According to a method disclosed in Japanese Laid-Open Patent Publication No. 5-55142, by implanting silicon ($Si^+$) ions into an amorphous silicon film by an ion implantation method and then by heat-treating the film, a polycrystalline silicon film composed of grains having a size of several $\mu$m can be grown. According to a method disclosed in Japanese Laid-Open Patent Publication No. 5-136048, by spraying Si particles having a size of 10 to 100 nm along with a high-pressure nitrogen gas to an amorphous silicon film, a growth nucleus is formed. In both of these methods, by selectively introducing a foreign material into an amorphous silicon film as a nucleus for crystal growth, a crystalline silicon film of high quality is crystallized and a semiconductor device is formed by using the crystalline silicon film thus obtained.

However, according to the methods disclosed in Japanese Laid-Open Patent Publications Nos. 5-55142 and 5-136048, the introduced foreign material functions merely as a growth nucleus. More specifically, the foreign material contributes to the generation of nuclei and the control of the crystallization direction during the crystal growth, but the above-mentioned problems caused during the heat-treatment process for crystallization are still presented and insoluble.

In the method disclosed in Japanese Laid-Open Patent Publication No. 5-55142, the crystallization is realized by performing a heat-treatment at a temperature of 600° C. for forty hours. On the other hand, according to the method disclosed in Japanese Laid-Open Patent Publication No. 5-136048, a heat-treatment is performed at a temperature of 650° C. or higher. Therefore, these methods are applicable to a silicon-on-insulator (SOI) substrate or a silicon-on-sapphire (SOS) substrate. However, according to these technologies, it is difficult to form a crystalline silicon film on an inexpensive glass substrate so as to fabricate a semiconductor device. For example, Corning 7059 (product name; manufactured by Corning) glass, used for an active-matrix type liquid crystal display device, has a glass distortion point of 593° C. Accordingly, in consideration of a treatment of a large-scale substrate, a heat-treatment performed at a temperature of 600° C. or higher is unsuitable for such a glass substrate.

In order to solve the above-mentioned various problems, the present inventors have found a method for fabricating a crystalline silicon film in which the heat-treatment can be performed at a temperature low enough to realize the crystallization; the time required for the treatment can be shortened; and the influence of the grain boundaries can be minimized.

The present inventors have found that an amorphous silicon film can be crystallized by introducing a very small amount of metal elements, such as nickel or palladium, into the surface of the amorphous silicon film and then heat-treating the film at 550° C. for about four hours. This mechanism can be understood as follows. First, crystal nuclei are generated from the metal elements as the nuclei for crystal growth at an early stage of the heat treatment. Then the metal elements function as catalysts for promoting crystal growth, thereby rapidly advancing the crystallization. Hereinafter, these metal elements will be called "catalyst elements". The crystalline silicon film crystallized by the use of these catalyst elements as promoters has a plurality of needle-like crystals and column-like crystals, unlike the twin crystal structure of the crystal grains grown from a nucleus by a generally used solid-phase growth method. The respective needle-like crystals and the column-like crystals are in an ideal single crystalline state.

The present inventors have confirmed that, by fabricating a TFT using such a crystalline silicon film as an element region, the field-effect mobility can be increased by about 1.2 times as compared with the case of using a crystalline silicon film formed by a generally used solid-phase growth method.

In addition, the present inventors have also found that, by selectively introducing catalyst elements into a part of an amorphous silicon film and then by heat treating the film, only the region into which the catalyst elements have been introduced can be selectively crystallized while maintaining the other region into which the catalyst elements have not been introduced in an amorphous silicon state. Furthermore, the present inventors have discovered the phenomenon that the amorphous silicon film is crystallized in a lateral direction from the region into which the catalyst elements have selectively been introduced, i.e., in a direction substantially parallel to the surface of the substrate, by prolonging the heat treatment time.

This laterally crystallized region is full of needle-like crystals or column-like crystals which have been crystallized in a substantially single direction. Therefore, such a region has a crystallinity more satisfactory than that of a region where the growth nuclei have been generated at random by a direct introduction of the catalyst elements. In such a case, the catalyst elements contributing to the crystallization exist in the top end portions of the needle-like crystals or the column-like crystals, i.e., in the foremost portion of the laterally crystallized region.

That is to say, if the catalyst elements are efficiently contributing to the crystallization, then the catalyst elements exist only in the foremost portion of the crystal growth region where the crystallization is now proceeding, and substantially no catalyst elements exist in the laterally crystallized region. Therefore, the concentration of the catalyst elements in the crystalline silicon film laterally crystallized becomes smaller than the concentration of the catalyst elements in the region crystallized by the direct introduction of the catalyst elements by one order of magnitude (×10). The reduction of the concentration of the catalyst elements also makes it advantageous to use the laterally crystallized region as an element region for a semiconductor device.

Though the above-described crystallization method found by the present inventors is an effective technology, the method has the following problems.

The first problem relates to the influence of these catalyst elements upon the semiconductor device. If a large quantity of such catalyst elements exists in a semiconductor, then it is natural that reliability and electric stability of a device using the semiconductor are unpreferably degraded. In other words, the catalyst elements functioning as promoters of crystallization are needed for crystallizing an amorphous silicon film, but it is preferable to eliminate the catalyst elements from thus formed crystallized silicon film as much as possible. In order to accomplish this objective, it is necessary to select a catalyst element which tends to be highly inactive in crystalline silicon and perform the crystallization using a minimum amount of catalyst element by reducing the amount of the catalyst element required for the crystallization as much as possible. However, in actuality, it is very difficult to perform a low-concentration control using a very small amount of catalyst elements.

The second problem relates to damage of the crystalline silicon film which is likely to cause an etching error during subsequent process steps. In the region crystallized by directly introducing the catalyst elements thereto so as to generate growth nuclei at random, in particular, the catalyst elements have turned into silicides and are non-uniformly distributed around the grain boundaries. In fact, such a crystalline silicon film is not purely crystalline, but crystalline silicon and silicides are non-uniformly distributed therein. Such a non-uniform distribution is likely to cause a non-uniform etching with an etching residue, pin holes or the like during the subsequent etching process. Particularly, in performing an etching process using hydrofluoric acid (HF) which is indispensable for fabricating a semiconductor device, the suicides non-uniformly distributed around the grain boundaries thereof are selectively etched and pin holes are unintentionally formed.

In the case of laterally crystallizing the amorphous silicon film from the region into which the catalyst elements have been selectively introduced, if a region away from the element region (active region) is selected as the catalyst element introduction region, then the above-mentioned etching error is not caused in the element region. However, since the etching is performed through the pin holes formed in the crystalline silicon film over an underlying film or a glass substrate which is located under the region into which the catalyst elements have directly been introduced, similar pin holes are adversely formed in the underlying film or the glass substrate. The formation of the pin holes in the underlying film or the glass substrate is likely to decrease the transparency of the substrate or cause a disconnection of the bus lines to be formed later, so that the production yield is reduced.

The third problem relates to a layout of the element. This problem is specific to the case of forming a crystalline silicon film by the lateral crystallization of an amorphous silicon film from the region into which the catalyst elements have selectively been introduced in the fabrication process steps of the element.

As described above, it is impossible to use the region into which the catalyst elements have directly been introduced as a part of an element region because the concentration of the catalyst elements in the region is high, the etching process cannot be performed uniformly there and the region causes much damage to the crystalline silicon film during the HF etching process, in particular. Therefore, in the case of applying the lateral crystallization method for an amorphous silicon film to the fabrication process of an element, the mask design is currently performed so that the region into which the catalyst elements are selectively introduced is totally away from the element region.

In order to improve the integration of a semiconductor device, it is important to design a semiconductor device so as to minimize the distance between adjacent element regions. However, in the case of using a laterally crystallized region, the selective introduction region is required to be provided away from the element region, so that the disposition of the selective introduction region becomes a hard obstacle for the high integration of the device. In addition, according to such a method, the area of the laterally crystallized region is required to be large enough to cover the entire element region. Therefore, the crystal growth distance is required to be extended by the extension of the crystal growth time, the increase in the concentration of the catalyst elements to be introduced, and the like which are not preferable for the fabrication process of the device.

SUMMARY OF THE INVENTION

The semiconductor device of the invention includes: a substrate having an insulating surface; and an element region formed by crystallizing an amorphous silicon film, the element region being provided on the insulating surface of the substrate. In the semiconductor device, the element region is constituted by a laterally crystallized region formed by crystallizing the amorphous silicon film from a linearly crystallized region crystallized by a selective introduction of catalyst elements for promoting a crystallization of the amorphous silicon film to a region surrounding the linearly crystallized region by performing a heat-treatment, and a concentration of the catalyst elements in at least one of the laterally crystallized region and the linearly crystallized region is controlled by a line width of an introduction setting region having a linear planar pattern, the line width being set so as to selectively introduce the catalyst elements.

In one embodiment, the element region includes at least a part of the laterally crystallized region and at least a part of the linearly crystallized region.

In another embodiment, the line width of the introduction setting region having the linear planar pattern is selected so that concentration of the catalyst elements in the linearly crystallized region becomes a concentration at which a damage caused by an etching process for the element region is substantially prevented in the linearly crystallized region, an underlying layer under the region, or the substrate, or a lower concentration.

In still another embodiment, the line width of the introduction setting region having the linear planar pattern is about 20 $\mu$m or less.

In still another embodiment, the line width of the introduction setting region having the linear planar pattern is about 10 $\mu$m or less.

In still another embodiment, at least a part of the linearly crystallized region is used as at least a part of a contact region between an element and lines in the element region, and at least a part of the laterally crystallized region is used as an active region defining characteristics of the element in the element region.

According to another aspect of the present invention, a method for fabricating a semiconductor device is provided. The method includes the steps of: forming an amorphous silicon film on a substrate; introducing catalyst elements for promoting a crystallization of the amorphous silicon film into the substrate or the amorphous silicon film before or after the amorphous silicon film is formed so that a region into which the catalyst elements are introduced becomes a linear region; selectively crystallizing the linear region of the amorphous silicon film into which the catalyst elements are introduced by a heat-treatment, thereby forming a linearly crystallized region; crystallizing the amorphous silicon film from the linearly crystallized region to a region surrounding the linearly crystallized region in a direction substantially parallel to a surface of the substrate by further continuing the heat-treatment, thereby forming the laterally crystallized region; and forming an element region to be used as a semiconductor device by using the laterally crystallized region. In this method, a concentration of the catalyst elements in the crystallized region of the amorphous silicon film is controlled by a line width of an introduction setting region having a linear planar pattern, the line width being set so as to selectively introduce the catalyst elements.

In one embodiment, the step of forming the element region includes a step of forming the element region for a semiconductor device using both of the linearly crystallized region and the laterally crystallized region.

In another embodiment, in selectively introducing the catalyst elements into the amorphous silicon film, the line width of the introduction setting region having the linear planar pattern is selected so that concentration of the catalyst elements in the linearly crystallized region becomes a concentration at which a damage caused by an etching process for the element region is substantially prevented in the linearly crystallized region, an underlying layer under the region, or the substrate or a lower concentration.

In still another embodiment, the selective introduction of the catalyst elements into the amorphous silicon film is performed by setting the line width of the introduction setting region to be about 20 $\mu$m or less.

In still another embodiment, the selective introduction of the catalyst elements into the amorphous silicon film is performed by setting the line width of the introduction setting region to be about 10 $\mu$m or less.

In still another embodiment, the method for fabricating the semiconductor device, further includes the steps of:

forming a contact region between an element and lines in the element region so that the linearly crystallized region is included in the contact region; and forming in the laterally crystallized region an active region defining characteristics of the element in the element region.

In still another embodiment, at least one element selected from the group consisting of Ni, Co, Pd, Pt, Cu, Ag, Au, In, Sn, Al and Sb is used as the catalyst elements for promoting the crystallization of the amorphous silicon film.

In the semiconductor device of the present invention, the element region provided on an insulating surface of the substrate is formed by the crystallization of an amorphous silicon film from the region crystallized by the selective introduction of the catalyst elements functioning as promoters of crystallization to the surrounding region by performing the heat-treatment. Accordingly, a crystalline silicon film for constituting the element region can exhibit an even higher crystallinity than a crystallinity resulting from a generally used solid-phase growth method. In addition, the crystallization of the amorphous silicon film by the heat-treatment is further promoted by the introduction of the catalyst elements, so that a crystalline silicon film of high quality can be formed with a high productivity. Moreover, since the heating temperature required for the crystallization can be reduced to 600° C. or lower, an inexpensive glass substrate can be used in this case.

In addition, since the catalyst element introduction region is a linear region and the catalyst elements contributing to the lateral crystallization exist in the peripheral portion of the introduction region, almost all the introduced catalyst elements can contribute to the crystallization and the catalyst elements trapped by the grain boundaries or the like in the center portion of the introduction region can be reduced.

Moreover, the concentration of the catalyst elements in at least one of the element region and the linear region is controlled by the line width of the introduction setting region with a linear planar pattern which is set so as to selectively introduce the catalyst elements. Accordingly, by adjusting the line width of the introduction setting region, the amount of the catalyst elements remaining in the introduction region can be reduced without changing the surface density in introducing the catalyst elements.

According to the present invention, if the line width of the catalyst element introduction setting region is set to be about 20 μm or smaller, then the concentration of the catalyst elements in the film can be substantially controlled by the line width of introduction setting region. As a result, the concentration of the catalyst elements in the introduction region can be considerably reduced and a laterally crystallized region with a sufficiently long distance can be obtained.

In addition, when the line width of the introduction region is smaller than the above-described value, the amount of the catalyst elements in the introduction region itself is reduced. Therefore, the concentration of the catalyst elements in the region, which has been laterally crystallized from the introduction region and is to become an element region for a semiconductor device, can be precisely controlled at a low level without being substantially affected by the method for introducing the catalyst elements.

According to the present invention, the line width of the introduction setting region with a linear planar pattern is selected so that the concentration of the catalyst elements in the crystallized linear region can be set at a value low enough to eliminate the adverse effects of the etching process in fabricating an element from the linear region or the member under the region or lower, so that the production yield of the semiconductor device can be considerably improved. In particular, in performing almost all of the catalyst element introduction methods, it is possible to substantially eliminate the damage caused by the etching process in the catalyst element introduction region by setting the line width of the introduction setting region to be about 10 μm or smaller.

As a result, the introduction region of the crystalline silicon film, which cannot be used as the semiconductor device region (element region) according to a conventional method because damage is likely to be caused by the etching process and the concentration of the catalyst elements is high, can be used as the element region.

The crystallinity of the laterally crystallized region is superior to that of the catalyst element introduction region. Therefore, according to the present invention, an active region of the element region defining the characteristics of an element is formed of the laterally crystallized silicon film while the contact region or a part thereof is formed of the crystalline silicon film for the catalyst element introduction region. As a result, a high-performance semiconductor device can be fabricated. In addition, since the catalyst element introduction region can also be used as the element region for the semiconductor device, the semiconductor device can be highly integrated and the growth distance of the laterally crystallized region becomes shorter than that of a conventional one, thereby increasing the throughput, e.g., shortening of the annealing time, and reducing the cost.

Furthermore, according to a method for fabricating a semiconductor device of the invention, the concentration of the catalyst elements in the region for crystallizing the amorphous silicon film is controlled by the line width of the introduction setting region having a linear planar pattern which is set so as to selectively introduce the catalyst elements. Accordingly, by adjusting the line width of the introduction setting region, the amount of the catalyst elements remaining in the introduction region can be easily reduced without changing the surface density in introducing the catalyst elements.

In addition, the element region is formed on an insulating surface of the substrate by the crystallization of an amorphous silicon film from the region into which the catalyst elements functioning as promoters of crystallization have been introduced to the surrounding region by performing the heat-treatment. As a result, the crystallinity of the element region becomes excellent where the crystals have grown along a single direction, and the amount of the catalyst elements contained in the element region can be further reduced.

Furthermore, if at least one element selected from the group consisting of Ni, Co, Pd, Pt, Cu, Ag, Au, In, Sn, Al and Sb is used as the catalyst element for promoting the crystallization of the amorphous silicon film, only a small amount of such an element is needed to advantageously promote the crystallization.

Thus, the invention described herein makes possible the advantage of providing a high-performance semiconductor device by controlling the concentration of the catalyst elements in accordance with a simple method for the purpose of efficiently utilizing the catalyst elements in the selective introduction region for the lateral crystallization and reducing the concentration of the residual catalyst elements in the selective introduction region, and a method for stably fabricating such a semiconductor device with a high production yield.

This and other advantages of the present invention will become apparent to those skilled in the art upon reading and understanding the following detailed description with reference to the accompanying figures.

BRIEF DESCRIPTION OF THE DRAWINGS

FIG. 6 is a plan view showing the layout of a CMOS circuit fabricated by a conventional method.

DESCRIPTION OF THE PREFERRED EMBODIMENTS

Figure 1A:
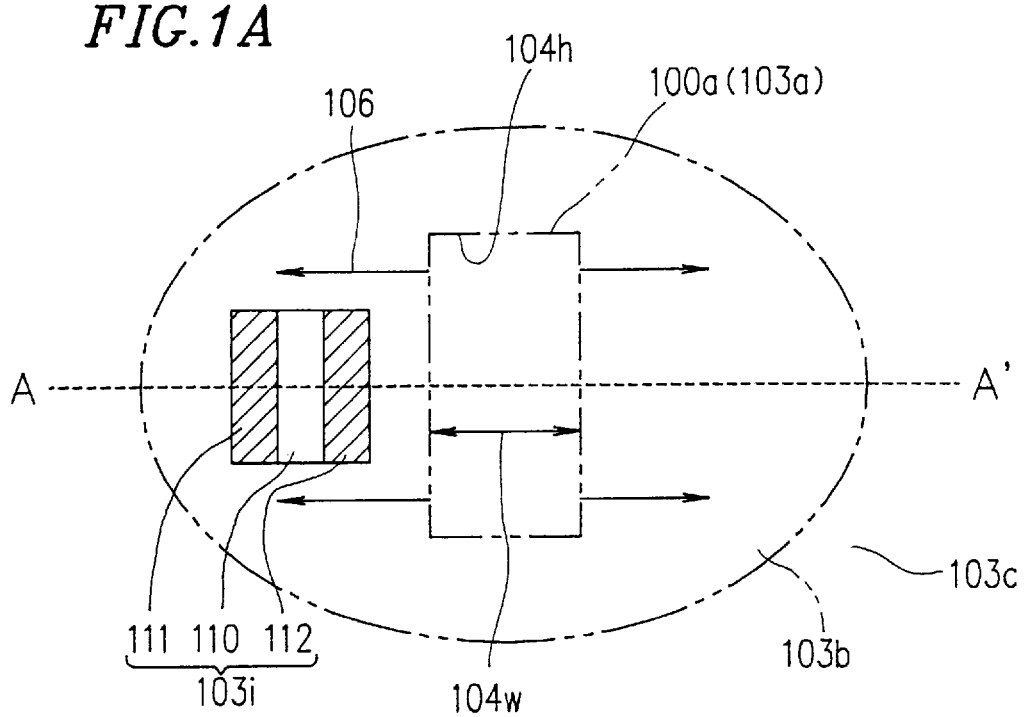
FIGS. 1A and 1B are plan views illustrating a semiconductor device and a method for fabricating the same according to a first example of the invention.

Hereinafter, the fundamental principles of the present invention will be described.

According to a conventional method for crystallizing an amorphous silicon film by using catalyst elements as the promoters of the crystallization, the amount of the catalyst elements introduced into the amorphous silicon film is controlled by the introduction method itself. However, according to the present invention, the concentration of the catalyst elements is not controlled by the introduction method itself as in conventional methods, but instead by the line width of the selective introduction region. In other words, by reducing the area of the selective introduction region for the catalyst elements, the concentration of the catalyst elements is totally reduced, and not by selecting the introduction method itself as conventional methods but instead by setting the pattern size of the selective introduction region for the catalyst elements at an optimal value beforehand, the concentration of the catalyst elements is controlled.

In the case where the catalyst elements for promoting the crystallization of the amorphous silicon film are selectively introduced and then the film is heat-treated, the crystallization is first generated from the catalyst elements functioning as growth nuclei in the introduction region. In this case, through the generation state of the crystal nuclei can be varied by selecting the method for introducing the catalyst elements, the nuclei are fundamentally generated at random. After the introduction region has been crystallized, the lateral crystallization advances to the region surrounding the introduction region.

According to the results obtained by the present inventors, all the catalyst elements do not contribute to the lateral crystallization in the introduction region for the catalyst elements because a large number of catalyst elements remain in a part of the region crystallized by the random generation of the crystal nuclei (in grain boundaries, in particular). That is to say, the catalyst elements contributing to the lateral crystallization exist only in the peripheral portion of the introduction region, while the catalyst elements in the center portion of the introduction region are trapped there by the grain boundaries or the like and remain in the center portion of the introduction region.

In addition, according to conventional methods, the concentration of the catalyst elements has been controlled by the introduction method itself. Therefore, in order to reduce the amount of the catalyst elements remaining in the introduction region, the amount of catalyst elements to be introduced cannot but be reduced. However, if the amount of catalyst elements to be introduced is reduced, then the amount of catalyst elements usable for the lateral crystallization is also reduced by the same proportion, so that a sufficiently long lateral crystallization distance cannot be obtained and it becomes difficult to fabricate a semiconductor device.

According to the present invention, the catalyst elements are introduced into a region defined so as to form a linear pattern, and the line width of the catalyst element introduction region is controlled, thereby efficiently utilizing the catalyst elements in the introduction region for the lateral crystallization. As a result, it is possible to considerably reduce the amount of the residual catalyst elements in the introduction region while obtaining a sufficiently long lateral crystallization distance. To sum up, one of the principal feature of the present invention lies in that the introduction region for the catalyst elements is defined so as to have a linear pattern and that the line width of the linear pattern is controlled. Therefore, the effects of the present invention cannot be attained by simply reducing the area of the introduction region.

Figure 5:
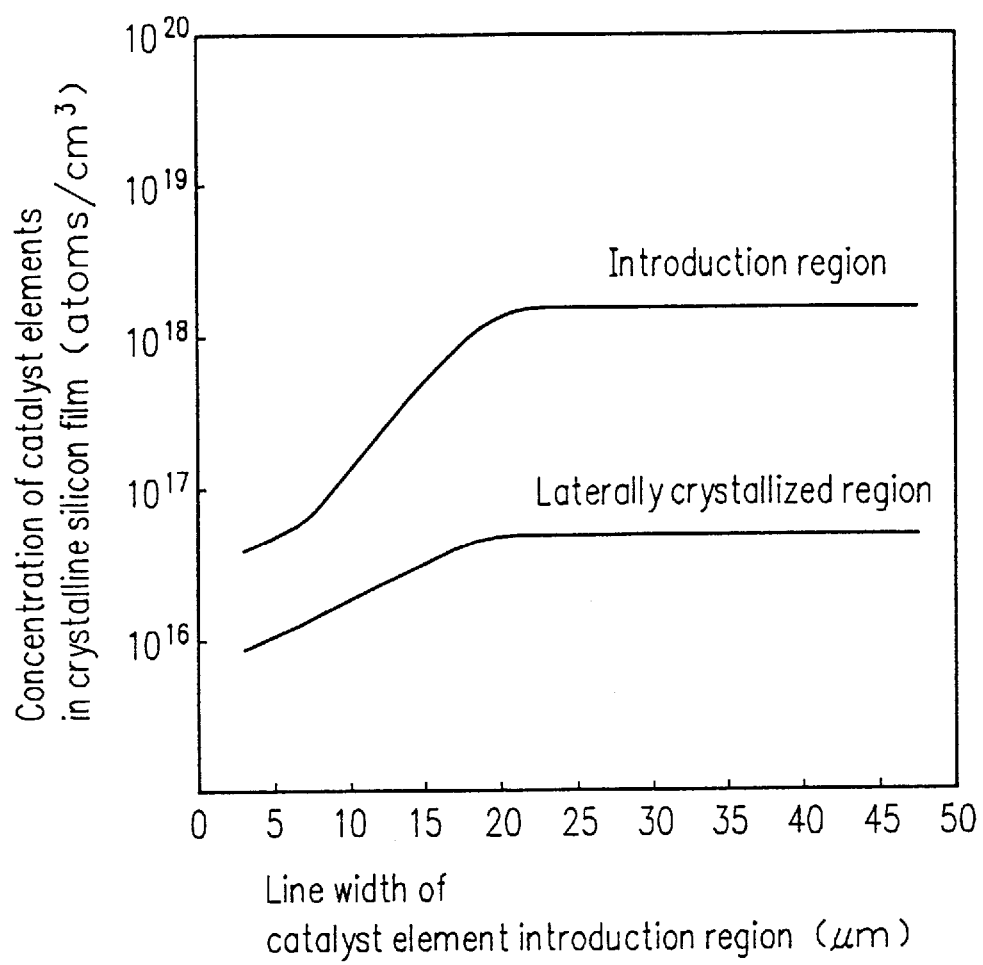
FIG. 5 is a graph showing the concentration of the catalyst elements in the laterally crystallized region and the catalyst element introduction region in the case where the catalyst elements are introduced into an amorphous silicon film at different line widths in accordance with a constant introduction method and a heat-treatment is performed.

FIG. 5 is a graph showing the concentration of the catalyst elements in the laterally crystallized region and the catalyst element introduction region in the case where the catalyst elements are introduced into an amorphous silicon film by varying the line width of the linear introduction region in accordance with a constant introduction method, and then the film is heat-treated so as to laterally crystallize the film. In FIG. 5, the abscissas indicate the line width of the catalyst element introduction region and the ordinates indicate the concentration of the catalyst elements in the crystalline silicon film.

As shown in FIG. 5, the concentration of the catalyst elements becomes constant and saturated when the line width of the catalyst element introduction region is a certain value (20 $\mu$m) or more, whereas the concentration of the catalyst elements decreases when the line width is smaller than the value. The concentration of the catalyst elements in the film considerably decreases in the catalyst element introduction region, in particular. The reason for the decrease can be understood as follows. If the width of the introduction region is small, then the proportion of the amount of catalyst elements, usable for the lateral crystallization, existing in the peripheral portion of the introduction region becomes large with respect to the amount of all the catalyst elements existing in the entire introduction region. In the laterally crystallized region, the concentration of the catalyst elements also decreases when the line width is about 20 $\mu$m or less, though the decrease is less drastic than that in the introduction region.

The introduction of the catalyst elements by a constant introduction method necessarily means that the surface density of the catalyst elements on the surface of the substrate is constant immediately after the introduction of the catalyst elements. That is to say, the amount of the catalyst elements directly introduced into the amorphous silicon film can be represented by the product obtained by multiplying the surface density of the introduced catalyst elements and the area of the selective introduction region together. Therefore, if the surface density of the introduced catalyst elements is constant and a sufficient amount of the catalyst elements in the introduction region can be utilized for the lateral crystallization, the concentration of the catalyst elements usable for the lateral crystallization and the concentration of the catalyst elements in the laterally crystallized region can be reduced as the area of the introduction region becomes smaller. It is noted that the "area" herein relates to the line width of the linear introduction region, and that the catalyst elements in the introduction region do not effectively contribute to the lateral crystallization by simply reducing the area of the introduction region.

Therefore, as shown in FIG. 5, the line width of the catalyst element introduction region is preferably about 20 µm or less. In such a case, the concentration of the catalyst elements in the film can be controlled by adjusting the line width; the concentration of the catalyst elements in the introduction region can be considerably reduced; and a laterally crystallized region with a sufficiently long distance can be obtained.

On the other hand, the size of the introduction region along the longitudinal direction thereof, i.e., the line length thereof, can be set at various values in accordance with the size of the element to be formed. However, the slit length is required to be no smaller than about 20 µm, and is preferably about 120 µm or more. This is because, when the slit length is about 120 µm or more, the lateral crystallization no longer depends upon the slit length.

In addition, when the line width of the introduction region is equal to or smaller than the value, the amount of the catalyst elements in the introduction region itself is reduced. Therefore, the concentration of the catalyst elements in the region, which has been laterally crystallized from the introduction region and is to become an element region for a semiconductor device, can be precisely controlled at a low level without being much affected by the method for introducing the catalyst elements.

Moreover, by reducing the line width of the catalyst element introduction region to a level low enough to prevent the damage given to the catalyst element introduction region or the underlying film by the etching process in fabricating an element after the crystallization process is finished, the disconnection of the bus lines and the like can be prevented in the introduction region, thereby considerably increasing the production yield of the semiconductor device.

The present inventors have confirmed that damage is actually caused by the etching process when the concentration of the catalyst elements in the film is approximately $1\times10^{17}$ atoms/cm$^2$ or higher. Therefore, by controlling the line width of the introduction region so as to set the concentration of the catalyst elements in the introduction region of the film to be lower than approximately $1\times10^{17}$ atoms/cm$^2$, the above objective can be accomplished. As shown in FIG. 5, when the line width of the introduction region is about 10 µm or less, the concentration of the catalyst elements in the introduction region of the film becomes lower than the value. Though some difference is caused in accordance the methods for introducing the catalyst elements, it is possible to substantially eliminate the damage caused by the etching process in the introduction region and improve the production yield of the semiconductor device by introducing the catalyst elements with a line width set to be equal to or smaller than about 10 µm in most cases.

According to conventional methods, since damage is likely to be caused by the etching process and the concentration of the catalyst elements is high in the introduction region of a crystalline silicon film, the introduction region cannot be used as an element region (or a semiconductor device region), as described above. However, according to the present invention, the introduction region of the crystalline silicon film can be used as the element region. The crystallinity of the laterally crystallized region is superior to that of the catalyst element introduction region. Therefore, an active region of the element region defining the characteristics of an element is preferably formed of the laterally crystallized silicon film while the contact region or a part thereof is preferably formed of the crystalline silicon film for the catalyst element introduction region. As a result, the above-mentioned problems relating to the layout of an element can be solved; the semiconductor device can be highly integrated; and the growth distance of the laterally crystallized region becomes shorter than that of a conventional one, thereby increasing the throughput, e.g., shortening of the annealing time, and reducing the cost.

In this specification, an "active region" refers to a region which is formed in the element region and directly defines the characteristics of the element. For example, in a MOS transistor, the "active region" is a channel region and the surrounding regions thereof and is a region affecting the mobility of the carriers. On the other hand, in this specification, an "element region" is a region including the "active region" and is a region including a region which does not directly define the characteristics of the element. For example, in a MOS transistor, the "element region" is a region including not only the channel region but also a contact region between the source region and the drain region, a contact region between the source region and the lines, a contact region between the drain region and the lines, and the like.

According to the present invention, in the case of using Ni as a catalyst element for promoting the crystallization of an amorphous silicon film, the most remarkable effect can be attained. Alternatively, if at least one element is selected from the group consisting of Co, Pd, Pt. Cu, Ag, Au, In, Sn, Al, and Sb are used as the catalyst element, only a small amount of such an element advantageously promotes the crystallization. Accordingly, the semiconductor device is not affected so much by the introduced catalyst element.

Hereinafter, the present invention will be described by way of illustrative examples with reference to accompanying drawings.

EXAMPLE 1

Figure 1B:
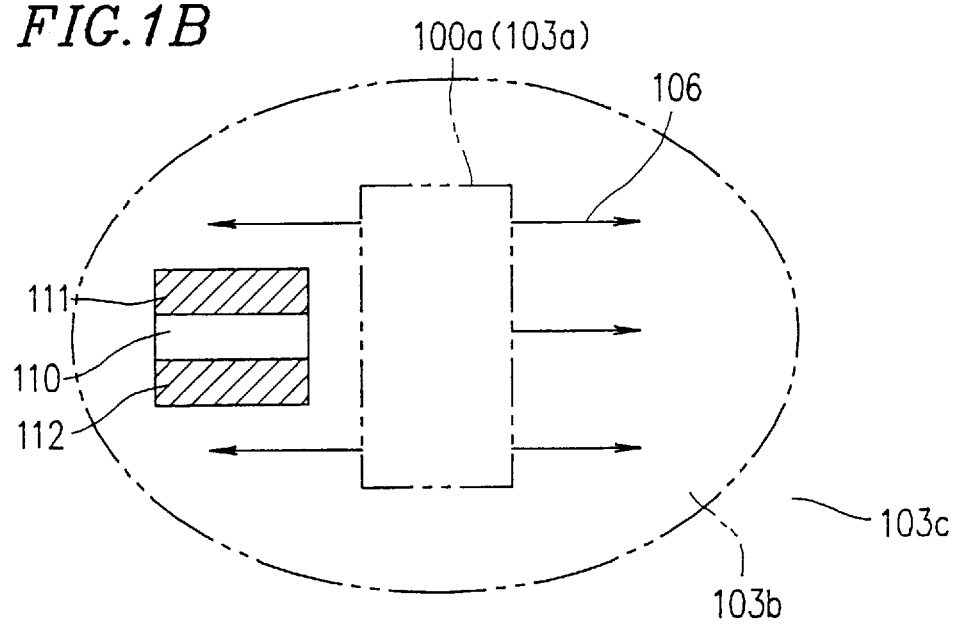

FIGS. 1A and 1B are plan views illustrating a semiconductor device and a method for fabricating the same according to a first example of the invention. FIGS. 2A to 2F are cross-sectional views, taken along the line A-A' in FIG. 1A, sequentially showing the process steps for fabricating the TFT according to the first example of the present invention.

Figure 2A:
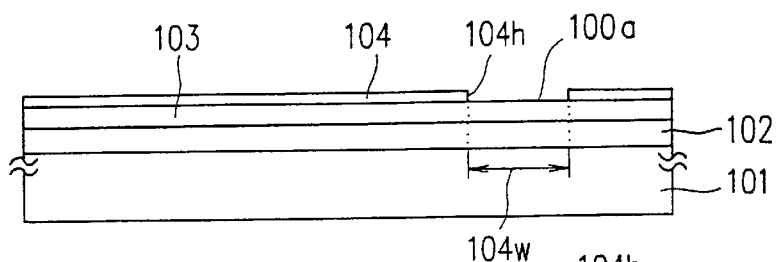
FIGS. 2A to 2F are cross-sectional views sequentially showing the process steps for fabricating the semiconductor device according to the first example of the invention.
Figure 2B:
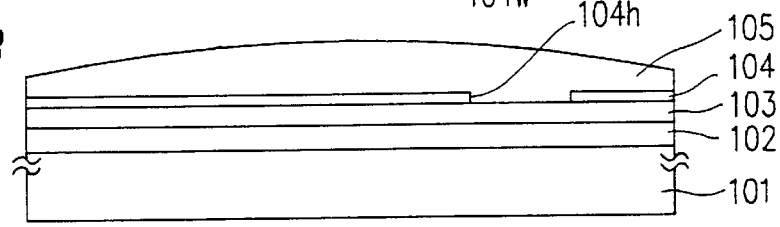
Figure 2C:
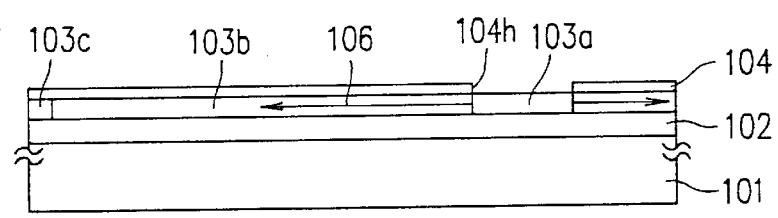
Figure 2D:
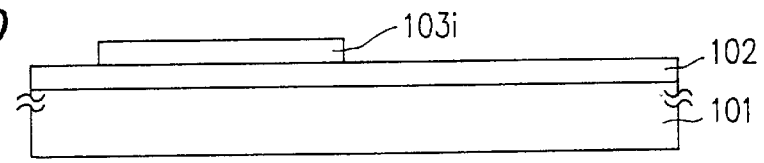
Figure 2E:
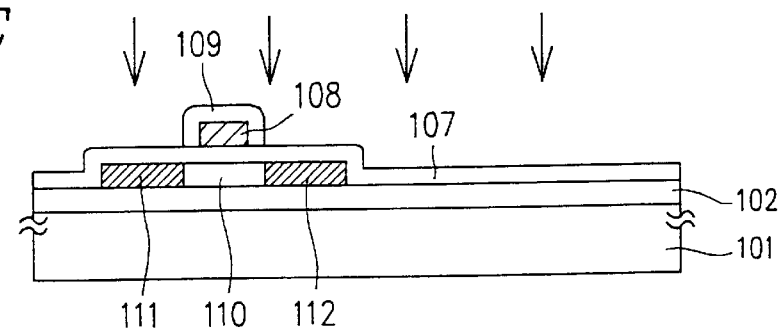
Figure 2F:
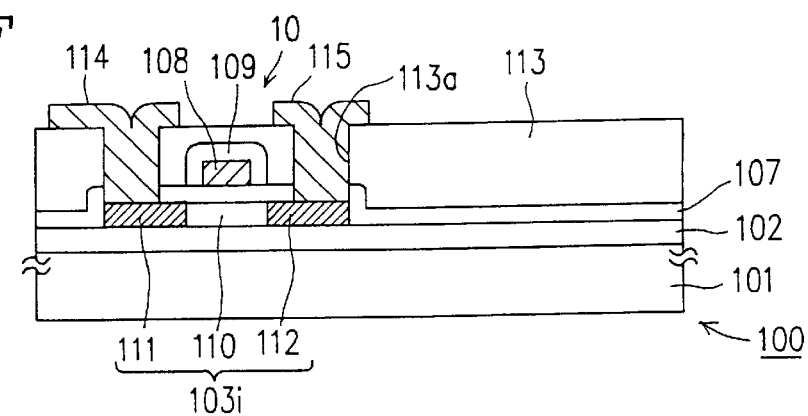

As shown in FIG. 2F, a semiconductor device 100 includes an N-type TFT 10. The TFT 10 is formed on a glass substrate 101 via an insulating underlying film 102 such as a silicon oxide film. An island-shaped crystalline silicon film 103i constituting the TFT 10 is formed on the insulating underlying film 102. A channel region 110 is formed in the center portion of the island-shaped crystalline silicon film 103i, and a source region 111 and a drain region 112 are formed on both sides thereof. A gate electrode 108 made of aluminum is provided over the channel region 110 via a gate insulating film 107. The surface of the gate electrode 108 is covered with an oxide layer 109. The entire surface of the TFT 10 is covered with an interlevel insulating film 113, and contact holes 113a are formed through the interlevel insulating film 113 at the portions corresponding to the source region 111 and the drain region 112. The source region 111 and the drain region 112 are connected to electrode lines 114 and 115 via the contact holes 113a, respectively.

As shown in FIG. 1A, the crystalline silicon film 103i is obtained by the crystallization of an amorphous silicon film 103 advancing from a linear region 103a, into which the catalyst elements functioning as the promoters for the crystallization are selectively introduced, to the region surrounding the linear region 103a along the direction 106 parallel to the surface of the substrate while performing the heat-treatment. The crystalline silicon film 103i consists of needle-like crystals or column-like crystals in which the crystal grains are substantially in a single crystalline state. The concentration of the catalyst elements in the crystalline silicon film 103i is controlled by the line width 104w of an opening (or a through hole) 104h of the mask through which the catalyst elements are selectively introduced.

The TFT 10 of this example can be used not only as a driver circuit for an active-matrix type liquid crystal display device and a device constituting the pixel portions, but also as a device for constituting a central processing unit (CPU) formed on the same substrate having these circuits and the pixel portions thereon. The TFT is applicable to a so-called thin-film integrated circuit as well as a liquid crystal display device.

Next, a method for fabricating the TFT 10 will be described.

First, an underlying film 102 made of silicon oxide having a thickness of about 200 nm is formed on a glass substrate 101 by a sputtering method or the like. This silicon oxide film is provided for preventing the impurities from diffusing from the glass substrate 101. Next, an intrinsic (type I) amorphous silicon film (a-Si film) 103 having a thickness in an approximate range of 25 to 100 nm, e.g., 80 nm, is grown thereon by a low-pressure chemical vapor deposition (LPCVD) method or a plasma CVD method.

Then, an insulating thin film such as a silicon oxide film or a silicon nitride film is deposited on the a-Si film 103 and then patterned so as to form a mask 104. A slit shaped region 100a of the a-Si film 103 is exposed through the through hole 104h of the mask 104. That is to say, as shown in FIG. 1A, if the device 100 in the state as shown in FIG. 2A is seen from above, the slit-shaped a-Si film 103 is exposed in a region 100a through the through hole 104h, while the other regions are still masked.

The line width 104w of the through hole 104h of the region functioning as a catalyst element introduction region during a subsequent process step is a key point of the present invention. The line width 104w is preferably set to be 20 $\mu$m or less, more preferably 10 $\mu$m or less. In this example, the line width 104w is set to be 10 $\mu$m. The length of the slit (through hole) is set to be about 120 $\mu$m in this example, and the slit length is preferably set to be about 120 $\mu$m or more because of the above-described reasons. The shape of the through hole need not be strictly linear, but may have some curvature so long as the through hole linearly extends. Also, the through hole can be formed so that the line width thereof is varied at the respective positions.

In this example, the TFT 10 is fabricated so that the source region 111 and the drain region 112 are disposed in parallel to the lateral crystallization direction 106. Alternatively, if the source region 111 and the drain region 112 are disposed in a direction vertical to the direction 106 as shown in FIG. 1B, the TFT can be fabricated in the same way without causing any problems.

After the mask 104 is formed, as shown in FIG. 2B, the substrate 101 is retained so that the exposed region 100a of the a-Si film 103 is in contact with a nickel-containing aqueous solution 105. In this example, the aqueous solution 105 contains nickel nitrate as a solvent and the concentration of nickel in the solution 105 is set to be 100 ppm. Then, the aqueous solution 105 is uniformly applied onto the entire surface of the substrate 101 and then dried. By performing this process step, nickel has been selectively introduced into the exposed region 100a of the a-Si film 103. Then, the film is annealed to be crystallized at a temperature of 550° C. for 16 hours under an inactive environment.

In this case, the amorphous silicon film 103 is crystallized in the region 100a from a crystal nucleus, i.e., nickel added to the surface of the a-Si film 103, in a direction vertical to the substrate 101, so that a crystalline silicon region 103a is formed. In this case, nickel is obstructed by the mask 104 and cannot reach the regions other than the region 100a of the a-Si film 103 under the mask. Then, as indicated by the arrow 106 in FIG. 2C, the crystals are growing from the region 100a in a lateral direction (or the direction parallel to the substrate) in the region surrounding the region 100a, so that a laterally crystallized crystalline silicon film 103b is formed. The other regions of the amorphous silicon film remain an amorphous silicon film region 103c.

The concentration of nickel in the laterally crystallized crystalline silicon film 103b is approximately $2 \times 10^{16}$ atoms/cm$^3$, while the concentration of nickel in the region 103a of the crystalline silicon film crystallized by the direct introduction of nickel, or a region which can be called a seed region, is approximately $1 \times 10^{17}$ atoms/cm$^3$. On the other hand, according to conventional methods where the line width 104w (larger than 20 $\mu$m) is not controlled, the concentration of nickel in the laterally crystallized crystalline silicon film 103b is approximately $5 \times 10^{16}$ atoms/cm$^3$, while the concentration of nickel in the introduction region 103a is approximately $1 \times 10^{18}$ atoms/cm$^3$.

Therefore, according to the present invention, the concentration of nickel in the laterally crystallized region 103b can be reduced to about one half of that obtained by the conventional method, and the concentration in the introduction region 103a can be reduced by one digit or more. When the crystals are growing, the distance of the crystal growth in a direction parallel to the substrate as indicated by the arrow 106 is approximately 80 $\mu$m.

Thereafter, as shown in FIG. 2D, the mask 104 is removed and the unnecessary portions of the amorphous silicon film 103 are removed so as to isolate the respective TFTs; thereby forming an island-shaped crystalline silicon film 103i to be used as an element region (the source, drain and channel regions) for a TFT. In this example, the mask 104 is removed by using buffered hydrofluoric acid (BHF). However, the nickel introduction region 100a is not damaged during the etching process in this example. On the other hand, according to a conventional method, etching damage such as pin holes is observed in the underlying film 102 under the nickel introduction region 100a in removing the mask 104.

Subsequently, a silicon oxide film having a thickness in an approximate range of 20 to 150 nm, e.g., 100 nm in this example, is formed as a gate insulating film 107 so as to cover the crystalline silicon film 103i to be used as an element region. The silicon oxide film is formed by decomposing and depositing tetra ethoxy ortho silicate (TEOS) to be used as a source gas with oxygen by heating the substrate at a temperature in a range of 150° to 600° C., more preferably in a range of 300° to 450° C. by an RF plasma CVD method. Also, the silicon oxide film can be formed by decomposing and depositing TEOS to be used as a source gas with ozone by heating the substrate at a temperature in a range of 350° to 650° C., more preferably in a range of 400° to 550° C. by a low-pressure CVD method or an atmospheric pressure CVD method. After the silicon oxide film has been deposited, the annealing is performed at a temperature in a range of 400° to 600° C. for 30 to 60 minutes under an inactive gas environment in order to improve the bulk characteristics of the gate insulating film itself and the characteristics in the interface between the crystalline silicon film and the gate insulating film.

Thereafter, aluminum is deposited by a sputtering method on the silicon oxide film so as to have a thickness of 400 to 800 nm, e.g., 600 nm. The aluminum film is then patterned so as to form a gate electrode 108. The surface of the aluminum gate electrode 108 is anodized, thereby forming an oxide layer 109 thereon, as shown in FIG. 2E. In this case, the anodization is conducted in an ethyleneglycol solution containing 1 to 5% tartaric acid by initially supplying a constant current so as to increase the voltage up to 220 V and then by maintaining the state for an hour, thereby completing the treatment. The thickness of the resulting oxide layer 109 is 200 nm. Since the thickness of the oxide layer 109 defines a length of an offset gate region during a subsequent ion doping process, the length of the offset gate region can be controlled by the anodization process.

Next, using the gate electrode 108 and the oxide layer 109 covering the gate electrode 108 as masks, the element region is doped with an impurity (phosphorus) by an ion doping method. Phosphine ($PH_3$) is used as a doping gas, the accelerating voltage is set to be in a range of 60 to 90 kV, e.g., 80 kV, and the implant dose is set to be in a range of $1\times10^{15}$ to $8\times10^{15}$ cm$^{-2}$, e.g., $2\times10^{15}$ cm$^{-2}$. By performing this process step, the impurity-doped regions 111 and 112 will respectively be used as the source and drain regions for the TFT 10; the undoped region 110 masked by the gate electrode 108 and the surrounding oxide layer 109 will be used as the channel region for the TFT 10.

Then, as shown in FIG. 2E, the annealing is conducted by the irradiation of the laser beam; thereby activating the doped impurity and improving the crystallinity of the doped portions which was deteriorated during the impurity implantation process. In this irradiation step, an XeCl excimer laser (wavelength: 308 nm and pulse width: 40 nsec) is irradiated at an energy density of 150 to 400 mJ/cm$^2$, more preferably in a range of 200 to 250 mJ/cm$^2$. The sheet resistance of the N-type impurity (phosphorus) regions 111 and 112 thus formed is in a range of 200 to 800Ω/□.

A silicon oxide film or a silicon nitride film having a thickness of about 600 nm is then formed as the interlevel insulating film 113. If a silicon oxide film is formed using TEOS as a source material by a plasma CVD method using oxygen, or by a low-pressure CVD method or an atmospheric-pressure CVD method using ozone, then a satisfactory interlevel insulating film excellent in step coverage can be obtained. If a silicon nitride film is grown using $SiH_4$ and $NH_3$ as source gases by the plasma CVD method, then the dangling bonds are terminated by hydrogen atoms supplied to the element region/gate insulating film interface, and the deterioration of the properties of a TFT can be advantageously suppressed.

Contact holes 113a are then formed in the interlevel insulating film 113 by performing an appropriate selective etching, thereby forming the electrode lines 114 and 115 for a TFT by using a double-layered film made of metallic materials such as titanium nitride and aluminum. In this case, the titanium nitride film is provided as a barrier film for preventing the diffusion of aluminum into the semiconductor layer. Finally, the annealing is conducted under a hydrogen environment at one atmospheric pressure at 350° C. for 30 minutes, thereby completing the TFT 10 as shown in FIG. 2F.

Where the TFT thus obtained is used as a switching element for a pixel electrode, one of the electrode lines 114 and 115 is connected to the pixel electrode formed by a transparent conductive film made of indium tin oxide (ITO) or the like and a signal is input from the other electrode. In the case where the TFT is used for a thin-film integrated circuit, it is also necessary to form a contact hole on the gate electrode 108 and to provide necessary lines.

In the N-type TFT fabricated according to the method of this example, substantially no damage is given to the underlying film 102 or the glass substrate 101 under the nickel introduction region 100a unlike a conventional TFT, so that the disconnection of the bus lines can be reduced and the production yield can be considerably improved. In addition, the TFT characteristics are also much improved. For example, the leakage current caused by the catalyst elements in the TFT off region can be reduced from a conventional value (in a range of 10 to 15 pA) to about 5 pA.

As described above, in the semiconductor device of this example, the element region 103i provided on an insulating surface of the substrate is formed by the crystallization of an amorphous silicon film 103 from the region 103a crystallized by the selective introduction of the catalyst elements functioning as promoters of crystallization to the region surrounding the region 103a by performing the heat-treatment. Accordingly, the crystalline silicon film 103b including the element region can exhibit an even higher crystallinity than a crystallinity resulting from a generally used solid-phase growth method.

In addition, since the catalyst element introduction region is a linear region 103a and the catalyst elements contributing to the lateral crystallization exist in the peripheral portion of the introduction region, almost all the introduced catalyst elements can contribute to the crystallization and the catalyst elements trapped by the grain boundaries or the like in the center portion of the introduction region can be reduced.

Moreover, the concentration of the catalyst elements in the element region 103i and the linear region 103a can be controlled by the line width 104w of the through hole 104h of the mask 104. Accordingly, by adjusting the line width 104w of the through hole 104h, the amount of the catalyst elements remaining in the introduction region 100a of the crystalline silicon film 103a can be reduced without changing the surface density of the film in introducing the catalyst elements.

Furthermore, in this example, the line width 104w of the through hole 104h is set to be equal to or smaller than 10 μm, the concentration of the catalyst elements in the introduction region 103a can be considerably reduced and a laterally crystallized region 103b with a sufficiently long distance can be obtained. In addition, the amount of the catalyst elements in the introduction region itself can be reduced, the concentration of the catalyst elements in the laterally crystallized region 103b used as an element region for the semiconductor device can be precisely controlled at a low level without being greatly affected by the method for introducing the catalyst elements.

Moreover, the line width 104w of the through hole 104h is selected so that the concentration of the catalyst elements in the crystallized linear region 103a can be set at a value low enough to prevent the adverse effects of the etching process in fabricating an element upon the linear region or the member under the region or lower, the production yield of the semiconductor device can be considerably improved. In other words, in performing almost all of the catalyst element introduction methods, it is possible to substantially eliminate the damage caused by the etching process in the catalyst element introduction region and the member under the region.

According to the method for fabricating a semiconductor device of this example, the concentration of the catalyst elements in the region for crystallizing the amorphous silicon film can be controlled by the line width 104w of the through hole 104h of the mask 104. Accordingly, by adjusting the line width 104w, the amount of the catalyst elements remaining in the introduction region 100a can be easily reduced without changing the surface density of the film in introducing the catalyst elements. In addition, the element region 103i is formed by the crystallization of an amorphous silicon film 103 from the region into which the catalyst elements functioning as promoters of crystallization have been introduced to the surrounding region by performing the heat-treatment. As a result, the crystallinity of the element region becomes excellent where the crystals have grown along a single direction, and the amount of the catalyst elements contained in the element region can be further reduced.

Furthermore, the crystallization of the amorphous silicon film 103 by the heat-treatment is promoted by the catalyst elements, so that a crystalline silicon film of high quality can be formed with a high productivity. In addition, the heating temperature required for the crystallization can be set to be 600° C. or lower, an inexpensive glass substrate can be used.

As a result, a high-performance semiconductor device exhibiting stable characteristics with the leakage current suppressed is realized and a highly integrated high-performance semiconductor device can be formed by performing simplified fabrication process steps with a high production yield.

EXAMPLE 2

Figure 3:
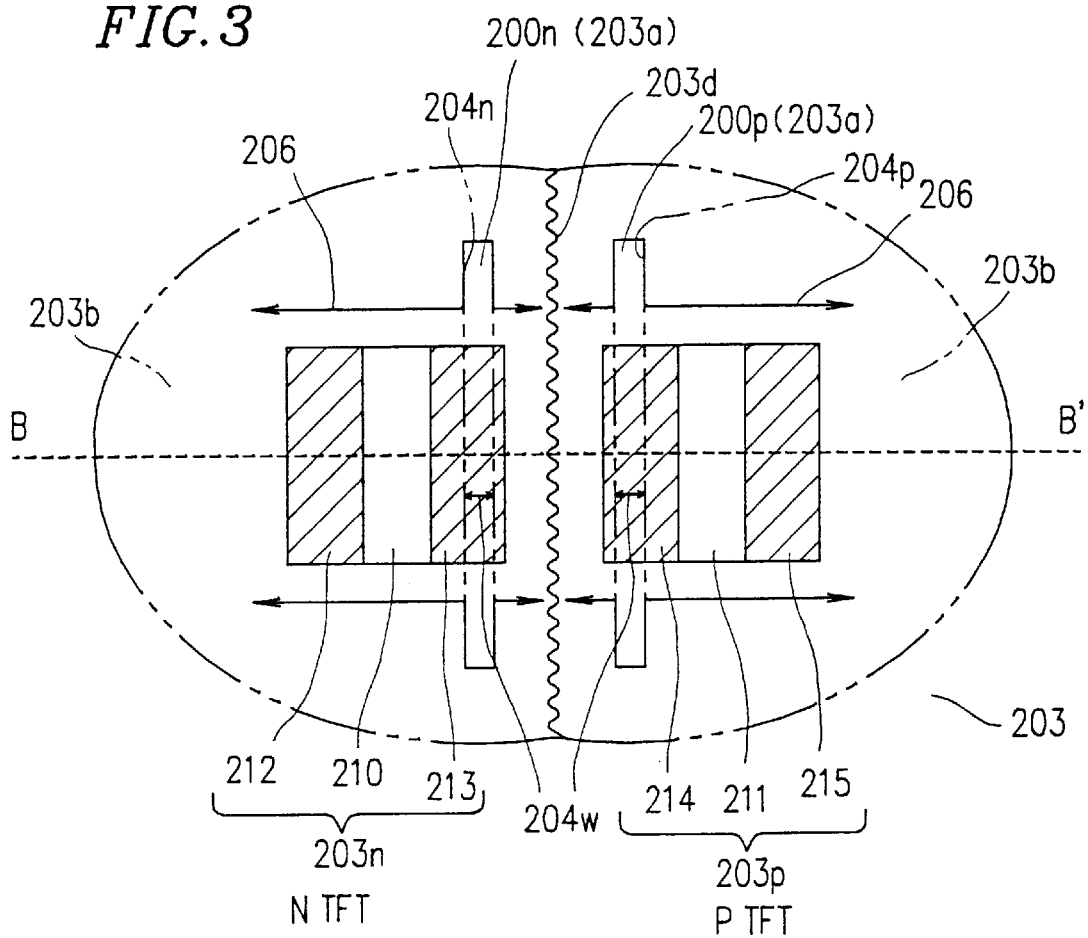
FIG. 3 is a plan view illustrating a semiconductor device and a method for fabricating the same according to a second example of the invention.

FIG. 3 is a plan view illustrating a semiconductor device and a method for fabricating the same according to a second example of the invention. FIGS. 4A to 4E are cross-sectional views, taken along the line B-B' in FIG. 3, sequentially showing the process steps for fabricating the TFT according to the second example of the present invention.

Figure 4A:
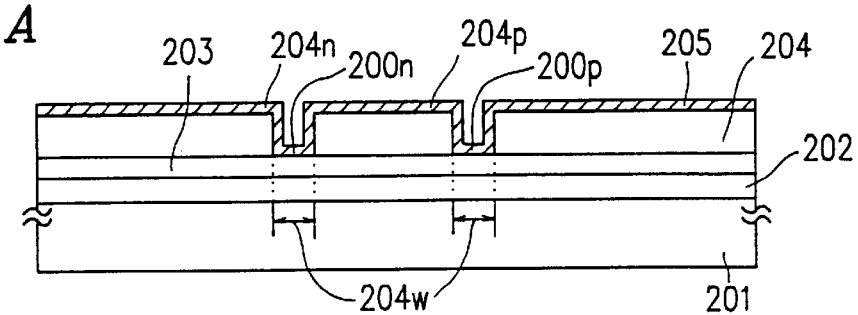
FIGS. 4A to 4E are cross-sectional views sequentially showing the process steps for fabricating the semiconductor device according to the second example of the invention.
Figure 4B:
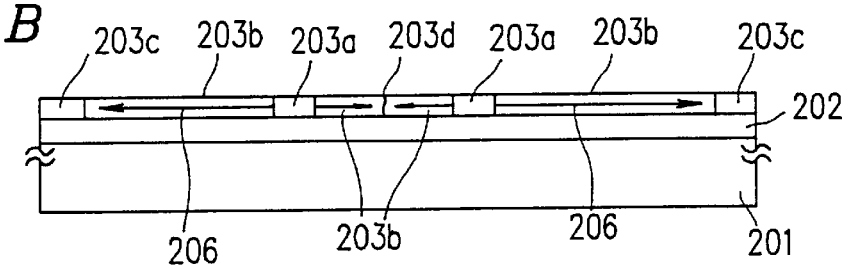
Figure 4C:
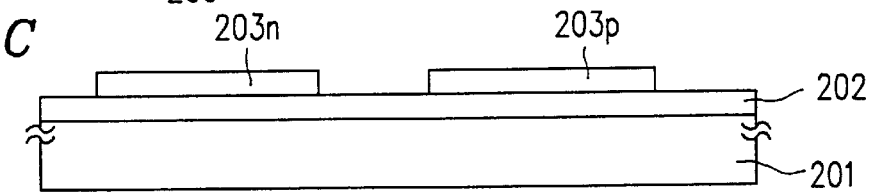
Figure 4D:
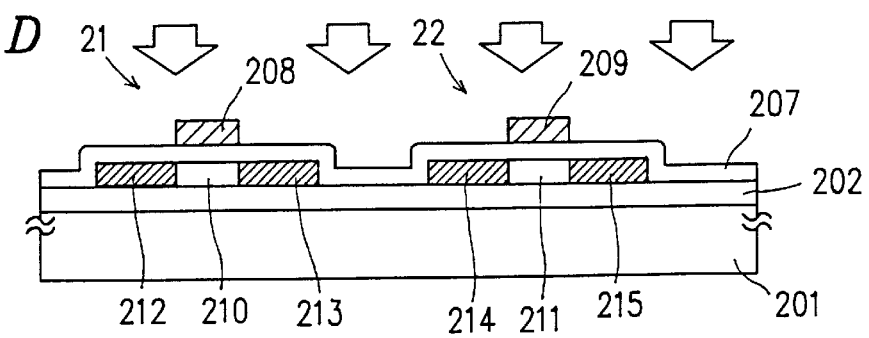
Figure 4E:
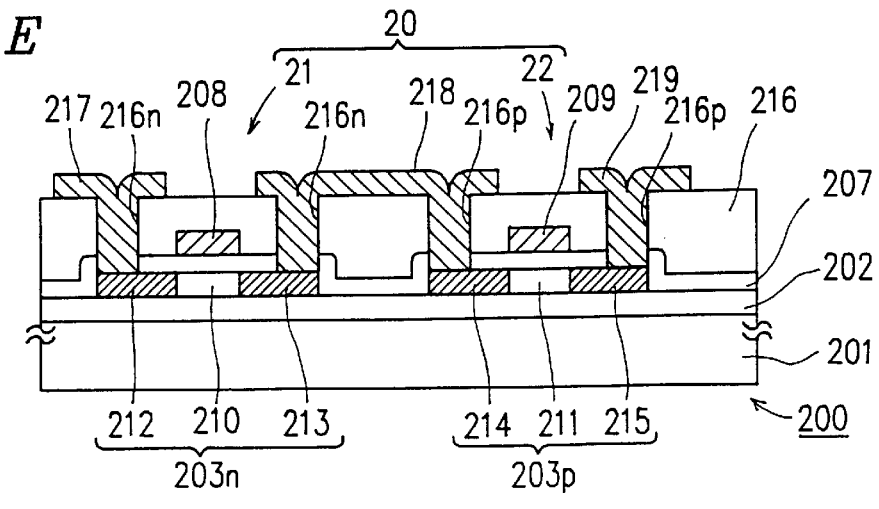

As shown in FIG. 4E, a semiconductor device 200 of this example includes a circuit 20 having a complementary metal-oxide-semiconductor (CMOS) structure for constituting a peripheral driver circuit for an active-matrix type liquid crystal display device or a so-called thin-film integrated circuit. This circuit 20 having a CMOS structure is obtained by connecting an N-type TFT 21 and a P-type TFT 22 so that these two TFTs 21 and 22 operate complimentarily, and is formed on a glass substrate 201.

The N-type TFT 21 and the P-type TFT 22 are formed respectively on the glass substrate 201 via an insulating underlying film 202 such as a silicon oxide film. Two island-shaped crystalline silicon films (element regions) 203n and 203p for constituting the TFTs 21 and 22 are formed on the insulating underlying film 202 so as to be adjacent to each other. These crystalline silicon films 203n and 203p include an N-type channel region 210 and a P-type channel region 211 in the central portions thereof. An N-type source region 212 and an N-type drain region 213 for the N-type TFT are formed on the right and left sides of the crystalline silicon film 203n. A P-type source region 214 and a P-type drain region 215 for the P-type TFT are formed on the right and left sides of the crystalline silicon film 203p.

Two aluminum gate electrodes 208 and 209 are provided over the N-type channel region 210 and the P-type channel region 211 via a gate insulating film 207. The entire surfaces of the TFTs 21 and 22 are covered with an interlevel insulating film 216. Contact holes 216n are formed in the portions of the interlevel insulating film 216 corresponding to the source region 212 and the drain region 213 of the N-type TFT 21 while contact holes 216p are formed in the portions of the interlevel insulating film 216 corresponding to the source region 214 and the drain region 215 of the P-type TFT 22. The source region 212 and the drain region 213 of the N-type TFT 21 are connected to electrode lines 217 and 218 through these contact holes 216n, while the source region 214 and the drain region 215 of the P-type TFT 22 are connected to electrode lines 218 and 219 through these contact holes 216p.

In this example, the element regions 203n and 203p include the linear regions 200n and 200p into which the catalyst elements for promoting the crystallization of the amorphous silicon film 203 have been selectively introduced, and are formed by crystallizing the amorphous silicon film from the linear regions to the surrounding regions by the heat-treatment. In the element regions 203n and 203p, the concentration of the catalyst elements is controlled by the line width of the linear regions 200n and 200p into which the catalyst elements have been selectively introduced.

Therefore, the TFTs 21 and 22 of this example have a layout where the crystalline silicon film 203a formed by crystallizing the linear regions (catalyst element introduction regions) 200n and 200p into which the catalyst elements have been directly introduced is used as a part of the element regions 203n and 203p.

On the other hand, the layout of the element regions of the TFTs of the CMOS circuit fabricated by utilizing conventional crystallization technologies is shown in FIG. 6. As shown in FIG. 6, according to conventional methods, the introduction region 300 into which the catalyst elements are directly introduced is disposed outside the element regions 303n and 303p. Therefore, the distance L between the element region 303n of the N-type TFT and the element region 303p of the P-type TFT is restricted by the line width 300w of the introduction region 300, and the distance between the elements cannot be shortened. In FIG. 6, the reference numerals 310 and 311 denote the channel regions in the element regions 303n and 303p of the N-type TFT and the P-type TFT, respectively; 312 and 313 denote the N-type source region and drain region in the element region 303n; and 314 and 315 denote the P-type source region and drain region in the element region 303p.

Strictly speaking, the distance L between the elements is limited by the sum of the line width 300w of the introduction region 300 and the alignment margin in performing the mask alignment. Accordingly, an even longer distance is necessary between the elements. However, according to the present invention, the concentration of the catalyst elements in the catalyst element introduction region can be considerably reduced, so that the layout described in this example can be used; the distance L between the elements is not restricted by anything and can be set at a minimum size to be patterned; and the integration degree of the semiconductor device can be improved.

Next, a method for fabricating the CMOS circuit will be described.

First, an underlying film 202 made of silicon oxide having a thickness of about 100 nm is formed on the glass substrate 201 by an atmospheric pressure CVD method or the like. Then, an intrinsic (type I) amorphous silicon film (a-Si film) 203 having a thickness in the range of 25 to 100 nm, e.g., 50 nm, is deposited by a low-pressure CVD method.

Next, a photosensitive resin (photoresist) is applied onto the a-Si film 203, and then exposed and developed so as to form a mask 204. Slit-shaped regions of the a-Si film 203 are exposed through the through holes 204n and 204p of the photoresist mask 204 in the regions 200n and 200p. That is to say, as shown in FIG. 3, if the device 200 in the state as shown in FIG. 4A is seen from above, the slit-shaped a-Si film 203 is exposed in the regions 200n and 200p, while the other regions are still masked by the photoresist. In this example, the line width 204w of the through holes 204n and 204p is set to be about 5 $\mu$m. The length of the slit (through hole) is set to be about 250 $\mu$m, and the slit length is preferably set to be about 120 $\mu$m or more because of the above-described reasons.

After the mask 204 is formed, a nickel thin film 205 is deposited on the surface of the substrate 201 as shown in FIG. 4A. In this example, by setting the distance between the deposition source and the substrate to be longer than usual so as to reduce the deposition rate, the thickness of the nickel thin film 205 is controlled to be about 1 nm. The surface density of the nickel thin film 205 on the substrate 201 measured approximately $4\times10^{13}$ atoms/cm$^2$. Then, as shown in FIG. 4B, by removing the photoresist mask 204, the nickel thin film 205 on the mask 204 is lifted off, so that a small amount of nickel is selectively introduced into the regions 200n and 200p of the a-Si film 203. Next, the annealing is performed under an inactive environment at a temperature of 550° C. for 16 hours, thereby crystallizing the regions 200n and 200p and forming the crystalline silicon film 203a.

In this case, the amorphous silicon film 203 is crystallized in the regions 200n and 200p from a crystal nucleus, i.e., nickel added to the surface of the a-Si film 203, in a direction vertical to the substrate 201, so that a crystalline silicon film 203a is formed. In the regions surrounding the regions 200n and 200p, as indicated by the arrow 206 in FIG. 4B, the crystals are growing from the regions 200n and 200p in a lateral direction (or the direction parallel to the substrate), so that a laterally crystallized crystalline silicon film 203b is formed. In this case, in the region where the regions 203b laterally crystallized from the regions 200n and 200p come into contact with each other, the lateral crystallization is stopped and the grain boundaries 203d are formed. The other regions of the amorphous silicon film 203 remain amorphous silicon film regions 203c.

The concentration of nickel in the laterally crystallized crystalline silicon film 203b is approximately $1\times10^{16}$ atoms/cm$^3$, while the concentration of nickel in the region 203a of the crystalline silicon film crystallized by the direct introduction of nickel is approximately $7\times10^{16}$ atoms/cm$^3$. As compared with the concentration obtained by a conventional method, the concentration of nickel in the laterally crystallized region 203b is reduced to about one third, and the concentration in the nickel introduction region 203a is also reduced by one order of magnitude or more. The crystal growth distance in the direction parallel to the substrate as indicated by the arrow 206 is approximately 80 $\mu$m.

A laser beam is then irradiated onto the crystalline silicon film, thereby improving the crystallinity of the crystalline silicon regions 203a and 203b. In this example, an XeCl excimer laser (wavelength: 308 nm, pulse width: 40 nsec) is used. The laser beam irradiation is performed by heating the substrate at a temperature in the range of 200° to 450° C., e.g., 400° C., and at an energy density in the range of 200 to 350 mJ/cm$^2$, e.g., 250 mJ/cm$^2$.

Then, as shown in FIG. 4C, the unnecessary portions of the crystalline silicon film 203a, other than the portions to be used as the element regions (or the active regions) 203n and 203p for the TFTs during a subsequent process step, are then removed by an etching process so as to isolate the respective TFTs.

Subsequently, a silicon oxide film having a thickness of 100 nm is formed as a gate insulating film 207 so as to cover the crystalline silicon regions 203n and 203p to be used as the element regions. The gate insulating film 207 is formed by decomposing and depositing tetra ethoxy ortho silicate (TEOS) to be used as a source gas with oxygen by heating the substrate at a temperature of 350° C. by an RF plasma CVD method.

Thereafter, as shown in FIG. 4D, an aluminum film (containing 0.1 to 2% silicon) is deposited thereon by a sputtering method so as to have a thickness in the range of 400 to 800 nm, e.g., 500 nm, and then patterned so as to form the gate electrodes 208 and 209.

Using the gate electrodes 208 and 209 as masking layers for the element regions 203n and 203p, respectively, the element region 203n is then doped with an impurity (phosphorus) and the element region 203p is doped with another impurity (boron) by an ion doping method. In this case, phosphine (PH$_3$) and diborane (B$_2$H$_6$) are used as doping gases; the accelerating voltage for doping phosphorus is set to be in the range of 60 to 90 kV, e.g., 80 kV, and the accelerating voltage for doping boron is set to be in the range of 40 to 80 kV, e.g., 65 kV; and the implant dose is set to be in the range of $1\times10^{15}$ to $8\times10^{15}$ cm$^{-2}$, e.g., $2\times10^{15}$ cm$^{-2}$ for phosphorus and $5\times10^{15}$ cm$^{-2}$ for boron. By performing this process step, the regions which are not doped with the impurities being masked by the gate electrodes 208 and 209 will be used as the channel regions 210 and 211 for the TFTs 21 and 22. When performing the doping, the respective elements are selectively doped by masking the regions with photoresists which are not to be doped. As a result, N-type impurity regions 212 and 213 and P-type impurity regions 214 and 215 are formed, thereby forming the N-channel type TFT (or N-type TFT) 21 and the P-channel type TFT (or P-type TFT) 22 as shown in FIG. 4D.

Then, as shown in FIG. 4D, the annealing is conducted by the irradiation of the laser beam, thereby activating the doped impurity. In this irradiation process step, an XeCl excimer laser (wavelength: 308 nm and pulse width: 40 nsec) is irradiated at the energy density of 250 mJ/cm$^2$. The irradiation is conducted by focusing two pulses of the laser beam on each scanning position.

Next, as shown in FIG. 4E, a silicon oxide film having a thickness of 600 nm is then formed by a plasma CVD method as an interlevel insulating film 216. The contact holes 216n and 216p are formed in the interlevel insulating film 216, thereby forming the electrode lines 217, 218 and 219 for the TFTs using a double-layered film made of titanium nitride and aluminum. Finally, the annealing is performed at 350° C. for 30 minutes in a hydrogen environment at one atmospheric pressure, thereby completing the N-type TFT 21 and the P-type TFT 22.

In the circuit having a CMOS structure fabricated by the above-described method of this example, the N-type TFT 21 and the P-type TFT 22 have high field-effect mobilities of 150 to 180 cm$^2$/Vs and 100 to 120 cm$^2$/Vs, respectively, and have the threshold voltages of 1.5 to 2 V and −2 to −3 V, respectively. Therefore, these TFTs exhibit very satisfactory characteristics. The leakage current in the TFT off region can be reduced as compared with the leakage current generated by a conventional method, i.e., about 5 pA in the N-type TFT 21 and about 3 pA in the P-type TFT 22. In addition, the distance between the two TFTs can be shortened as compared with the distance in conventional methods, thereby highly integrating the semiconductor device.

According to conventional methods, since a damage is likely to be caused by an etching process and the concentration of the catalyst elements is high in the introduction region of a crystalline silicon film 203*a*, the introduction region cannot be used as an element region (or a semiconductor device region), as described above. However, in this example of the present invention, the introduction region of the crystalline silicon film can be advantageously used as the element region. The crystallinity of the laterally crystallized region is superior to that of the catalyst element introduction region. Therefore, an active region of the element region defining the characteristics of an element is formed of the laterally crystallized silicon film 203*b* while a part of the contact region is formed of the crystalline silicon film 203*a* for the catalyst element introduction region. As a result, a high-performance semiconductor device can be fabricated. In addition, since the catalyst element introduction regions can be used as the element regions 203*n* and 203*p* for the semiconductor device, the semiconductor device can be highly integrated and the growth distance of the laterally crystallized region becomes shorter than that of a conventional one, thereby increasing the throughput, e.g., shortening of the annealing time, and reducing the cost.

The present invention has been described by way of the above two examples. However, the present invention is not intended to be limited by the two examples, but various modifications can be made based on the technological spirit of the present invention.

In the above-described two examples, a very small amount of nickel is introduced into an amorphous silicon film so as to crystallize the amorphous silicon film by applying a nickel-based aqueous solution onto the surface of the amorphous silicon film or by forming a nickel thin film on the surface of the film by a vapor deposition method. Alternatively, the crystallization of the amorphous silicon film can be performed, for example, by selectively introducing nickel into the surface of the underlying film before depositing the amorphous silicon film and then by diffusing nickel from the lower side of the amorphous silicon film. In other words, the crystallization can be performed either from the upper side or the lower side of the amorphous silicon film. In addition, various other methods can also be used for introducing nickel. For example, nickel can be diffused from the SiO$_2$ film by using a spin-on-glass (SOG) material as a solvent for the nickel-based aqueous solution; a nickel thin film can be formed by a sputtering method, a plating method or the like; or nickel can be directly introduced by an ion doping method. Furthermore, the same effects can be attained by using cobalt, palladium, platinum, copper, silver, gold, indium, tin, antimony, or aluminum, as a impurity metal element for promoting the crystallization in place of nickel.

In the second example, the heat treatment is conducted by irradiating an excimer laser (or pulse laser) beam in order to improve the crystallinity of the crystalline silicon film. Other kinds of laser beams (e.g., a continuously oscillating Ar laser beam) can also be used for conducting a similar heat treatment. In addition, a so-called rapid thermal annealing (RTA) or a rapid thermal process (RTP) for heating a sample up to a temperature of 1000° to 1200° C. (i.e., the temperature of a silicon monitor) in a short period of time by using light, as intense as the laser beam, such as light emitted from an infrared light source and a flash lamp can also be utilized.

The present invention is applicable to various devices other than an active-matrix type substrate for a liquid crystal display. For example, the invention is applicable to various devices such as a close-contact type image sensor, a driver-monolithic thermal head, a driver-monolithic optical write device or display device using organic electroluminescent (EL) elements as light-emitting elements, and a semiconductor device such as a three-dimensional IC. The organic electroluminescent (EL) elements herein refer to field-effect light-emitting elements using organic materials as the light-emitting materials. In the case of applying the present invention to these devices, high-performance characteristics such as a fast response and a high resolution are realized for these devices.

Furthermore, the present invention is broadly applicable not only to an MOS transistor described in the foregoing examples, but also to a semiconductor fabrication process in general utilizing a crystalline semiconductor as a material for the elements such as a bipolar transistor or an electrostatic inductive transistor.

As is apparent from the foregoing description, in the semiconductor device of the present invention, the element region provided on an insulating surface of the substrate is formed by the crystallization of an amorphous silicon film from the region crystallized by the selective introduction of the catalyst elements functioning as promoters of crystallization to the surrounding region by performing the heat-treatment. Accordingly, a crystalline silicon film for constituting the element region having an even higher crystallinity than a crystallinity resulting from a generally used solid-phase growth method can be advantageously formed with a high productivity and at a low temperature of 600° C. or lower.

In addition, since the catalyst element introduction region is a linear region and the catalyst elements contributing to the lateral crystallization exist in the peripheral portion of the introduction region, almost all the introduced catalyst elements can contribute to the crystallization and the catalyst elements trapped by the grain boundaries or the like in the center portion of the introduction region can be reduced.

Moreover, the concentration of the catalyst elements in at least one of the element region and the linear region is controlled by the line width of the introduction region defined so as to selectively introduce the catalyst elements. Accordingly, by adjusting the line width of the introduction region, the amount of the catalyst elements remaining in the introduction region can be reduced without changing the surface density in introducing the catalyst elements.

Furthermore, since the line width of the introduction setting region with a linear planar pattern is selected so that the concentration of the catalyst elements in the crystallized linear region can be set at a value low enough to prevent the adverse effects of the etching process in fabricating an element upon the linear region or the member under the region or lower, the production yield of the semiconductor device can be considerably improved. In particular, in performing almost all of the catalyst element introduction methods, it is possible to substantially eliminate the damage caused by the etching process in the catalyst element introduction region by setting the line width of the introduction region to be about 20 μm or smaller and preferably about 10 μm or smaller.

The crystallinity of the laterally crystallized region is superior to that of the catalyst element introduction region. Therefore, according to the present invention, an active region of the element region defining the characteristics of an element is formed of the laterally crystallized silicon film while the contact region or a part thereof is formed of the crystalline silicon film for the catalyst element introduction region. As a result, a high-performance semiconductor device can be fabricated. In addition, since the catalyst element introduction region can also be used as the element region for the semiconductor device, the semiconductor device can be highly integrated and the growth distance of the laterally crystallized region becomes shorter than that of a conventional one, thereby increasing the throughput, e.g., shortening of the annealing time, and reducing the cost.

Furthermore, according to a method for fabricating a semiconductor device of the invention, the concentration of the catalyst elements in the region for crystallizing the amorphous silicon film is controlled by the line width of the introduction setting region having a linear planar pattern which is set so as to selectively introduce the catalyst elements. Accordingly, by adjusting the line width of the introduction region, the amount of the catalyst elements remaining in the introduction region can be easily reduced without changing the surface density in introducing the catalyst elements.

In addition, the element region is formed by the crystallization of an amorphous silicon film from the region into which the catalyst elements functioning as promoters of crystallization have been introduced to the surrounding region by performing the heat-treatment. As a result, the crystallinity of the element region becomes excellent where the crystals have grown along a single direction, and the amount of the catalyst elements contained in the element region can be further reduced.

As is apparent from the foregoing description, according to the present invention, a high-performance semiconductor device having stable characteristics with the generation of a leakage current suppressed is realized, and a highly integrated high-performance semiconductor device can be obtained by performing simplified fabrication process steps. In addition, the productivity in the fabrication process steps can be considerably improved and the cost of the resulting product can be reduced. In particular, in the case of applying the present invention to a liquid crystal display device, a driver-monolithic active-matrix substrate is realized in which the switching characteristics of pixel switching TFTs necessary for an active matrix substrate are improved; highly-integrated high-performance TFTs can constitute the peripheral driver circuit section; and the active matrix section and the peripheral driver circuit section can be mounted on one and the same substrate. As a result, a high-performance module with a small size can be fabricated at a lower cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:

a substrate having an insulating surface; and an element region formed by crystallizing an amorphous silicon film, the element region being provided on the insulating surface of the substrate, wherein the element region is constituted by a laterally crystallized region formed by crystallizing the amorphous silicon film from a linearly crystallized region crystallized by a selective introduction of catalyst elements for promoting a crystallization of the amorphous silicon film to a region surrounding the linearly crystallized region by performing a heat-treatment, and wherein a concentration of the catalyst elements in at least one of the laterally crystallized region and the linearly crystallized region is controlled by a line width of an introduction setting region having a linear planar pattern, the line width being set so as to selectively introduce the catalyst elements.

2. A semiconductor device according to claim 1, wherein the element region comprises at least a part of the laterally crystallized region and at least a part of the linearly crystallized region.

3. A semiconductor device according to claim 1, wherein the line width of the introduction setting region having the linear planar pattern is selected so that concentration of the catalyst elements in the linearly crystallized region is no more than a concentration at which a damage caused by an etching process for the element region is substantially prevented in the linearly crystallized region, an underlying layer under the region, or the substrate.

4. A semiconductor device according to claim 1, wherein the line width of the introduction setting region having the linear planar pattern is about 20 μm or less.

5. A semiconductor device according to claim 1, wherein the line width of the introduction setting region having the linear planar pattern is about 10 μm or less.

6. A semiconductor device according to claim 2, wherein at least a part of the linearly crystallized region is used as at least a part of a contact region between an element and lines in the element region, and wherein at least a part of the laterally crystallized region is used as an active region defining characteristics of the element in the element region.

7. A semiconductor device according to claim 1, wherein at least one element selected from the group consisting of Ni, Co, Pd, Pt, Cu, Ag, Au, In, Sn, Al and Sb is used as the catalyst elements for promoting the crystallization of the amorphous silicon film.

8. A semiconductor device according to claim 1, wherein the concentration of the catalyst elements in the introduction setting region of the film is lower than $1 \times 10^{17}$ atoms/cm$^3$.

9. A semiconductor device according to claim 1, wherein a ratio of the concentration of the catalyst element in the introduction setting region to the concentration of the at least one of the laterally crystallized region is less than one order of magnitude.

* * * * *